US010084621B2

United States Patent
Song et al.

(10) Patent No.: US 10,084,621 B2
(45) Date of Patent: Sep. 25, 2018

(54) CLOCK DATA RECOVERY WITH NON-UNIFORM CLOCK TRACKING

(71) Applicant: QUALCOMM Incorporated, San Diego, CA (US)

(72) Inventors: Yu Song, San Diego, CA (US); Zhi Zhu, San Diego, CA (US); Miao Li, San Marcos, CA (US); Li Sun, Irvine, CA (US); Deqiang Song, San Diego, CA (US); Chia Heng Chang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/422,050

(22) Filed: Feb. 1, 2017

(65) Prior Publication Data

US 2018/0219704 A1  Aug. 2, 2018

(51) Int. Cl.
| | |
|---|---|
| *H03D 3/18* | (2006.01) |
| *H03D 3/24* | (2006.01) |
| *H04L 25/03* | (2006.01) |
| *H04L 12/26* | (2006.01) |
| *H04L 27/00* | (2006.01) |

(52) U.S. Cl.
CPC ........ *H04L 25/03273* (2013.01); *H04L 43/16* (2013.01); *H04L 2027/0069* (2013.01)

(58) Field of Classification Search
CPC .............. H04L 25/03273; H04L 43/16; H04L 2027/0069; H04L 7/033; H03L 7/087
USPC ....... 375/326, 327, 374, 375, 376, 346, 373; 327/156
See application file for complete search history.

(56) References Cited

U.S. PATENT DOCUMENTS

| | | | |
|---|---|---|---|
| 7,315,596 B2 | 1/2008 | Payne et al. | |
| 7,363,563 B1 | 4/2008 | Hissen et al. | |
| 8,279,992 B1 | 10/2012 | Li | |

(Continued)

FOREIGN PATENT DOCUMENTS

| | | |
|---|---|---|
| EP | 2536040 A1 | 12/2012 |
| EP | 3076553 A1 | 10/2016 |

OTHER PUBLICATIONS

Hanumolu P.K., et al., "A Wide-Tracking Range Clock and Data Recovery Circuit", IEEE Journal of Solid-State Circuits, IEEE Service Center, Piscataway, NJ, USA, vol. 43, No. 2, Feb. 1, 2008, pp. 425-439, XP011200738, ISSN: 0018-9200, DOI: 10.1109/JSSC.2007.914290.

(Continued)

*Primary Examiner* — Phuong Phu
(74) *Attorney, Agent, or Firm* — Loza & Loza, LLP/Qualcomm

(57) ABSTRACT

Systems and methods for adjusting a phase step size of a clock data recover (CDR) circuit are described according to aspects of the present disclosure. In certain aspects, a method for adjusting a phase step size of a CDR circuit includes sensing a frequency offset of the CDR circuit, and adjusting the phase step size of the CDR circuit based on the sensed frequency offset. The frequency offset may be sensed by sensing a signal level on an integration path of a loop filter of the CDR circuit. The phase step size of the CDR circuit may be adjusted by switching the CDR circuit between a first phase step size and a second phase step size using a modulator (e.g., a sigma-delta modulator).

22 Claims, 9 Drawing Sheets

(56) References Cited

U.S. PATENT DOCUMENTS

| | | |
|---|---|---|
| 9,036,764 B1 | 5/2015 | Hossain et al. |
| 9,306,730 B1 | 4/2016 | Shu et al. |
| 2005/0069071 A1 | 3/2005 | Kim et al. |
| 2005/0200391 A1* | 9/2005 | Steinbach ............... H03L 7/087 327/156 |
| 2015/0078495 A1* | 3/2015 | Hossain ................. H04L 7/033 375/346 |
| 2015/0180642 A1* | 6/2015 | Hsieh ................... H04L 7/0025 375/233 |

OTHER PUBLICATIONS

International Search Report and Written Opinion—PCT/US2018/013636—ISA/EPO—dated Apr. 5, 2018.

* cited by examiner

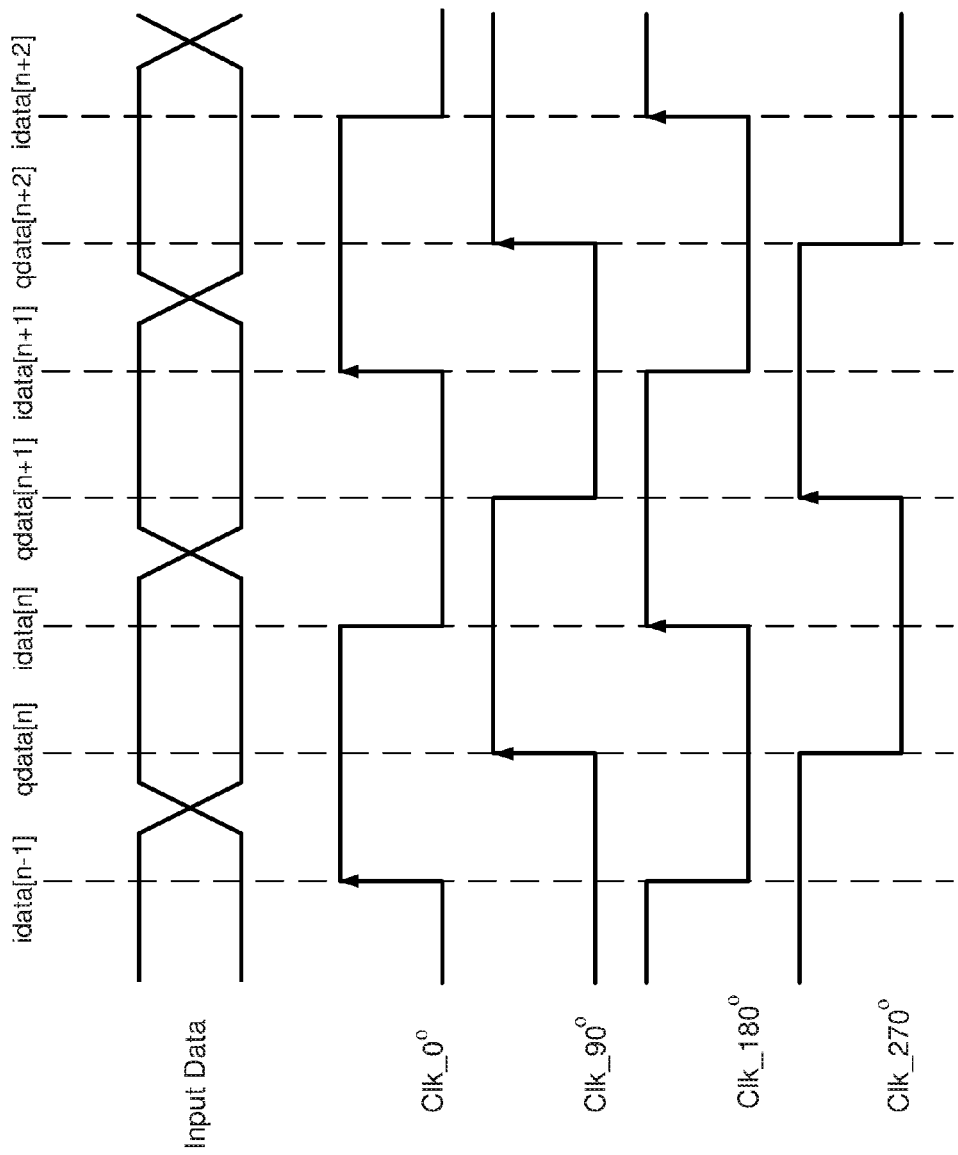

| idata[n] | qdata[n] | idata[n] | DECISION |
|---|---|---|---|
| 0 | 0 | 1 | Early (-1) |
| 1 | 1 | 0 | |
| 0 | 1 | 1 | Late(+1) |
| 1 | 0 | 0 | |
| 0 | X | 0 | Hold |
| 1 | X | 1 | |

FIG. 3

CLOCK DATA RECOVERY WITH NON-UNIFORM CLOCK TRACKING

BACKGROUND

Field

Aspects of the present disclosure relate generally to receivers, and more particularly to clock data recovery in receivers.

Background

A clock and data recovery (CDR) circuit is used in a receiver to recover a clock signal from a data signal. The recovered clock signal is used to sample the data signal to recover data in the data signal. Clock data recovery may be used, for example, to recover data in a data signal (e.g., high-speed serial data signal) that is received at the receiver without an accompanying clock signal.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

A first aspect relates to a method for adjusting a phase step size of a clock data recovery (CDR) circuit. The method includes sensing a frequency offset of the CDR circuit, and adjusting the phase step size of the CDR circuit based on the sensed frequency offset.

A second aspect relates to an apparatus. The apparatus includes a phase step adjuster configured to adjust a phase step size of a clock data recovery (CDR) circuit. The apparatus also includes a phase step controller configured to sense a frequency offset of the CDR circuit, and to control the phase step adjuster to adjust the phase step size of the CDR circuit based on the sensed frequency offset.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

BRIEF DESCRIPTION OF THE DRAWINGS

FIG. 2C is a timing diagram showing an example of the data signal and clock signals in which the clock signals are late according to certain aspects of the present disclosure.

FIG. 3 is a table showing logical functions of a phase detector according to certain aspects of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
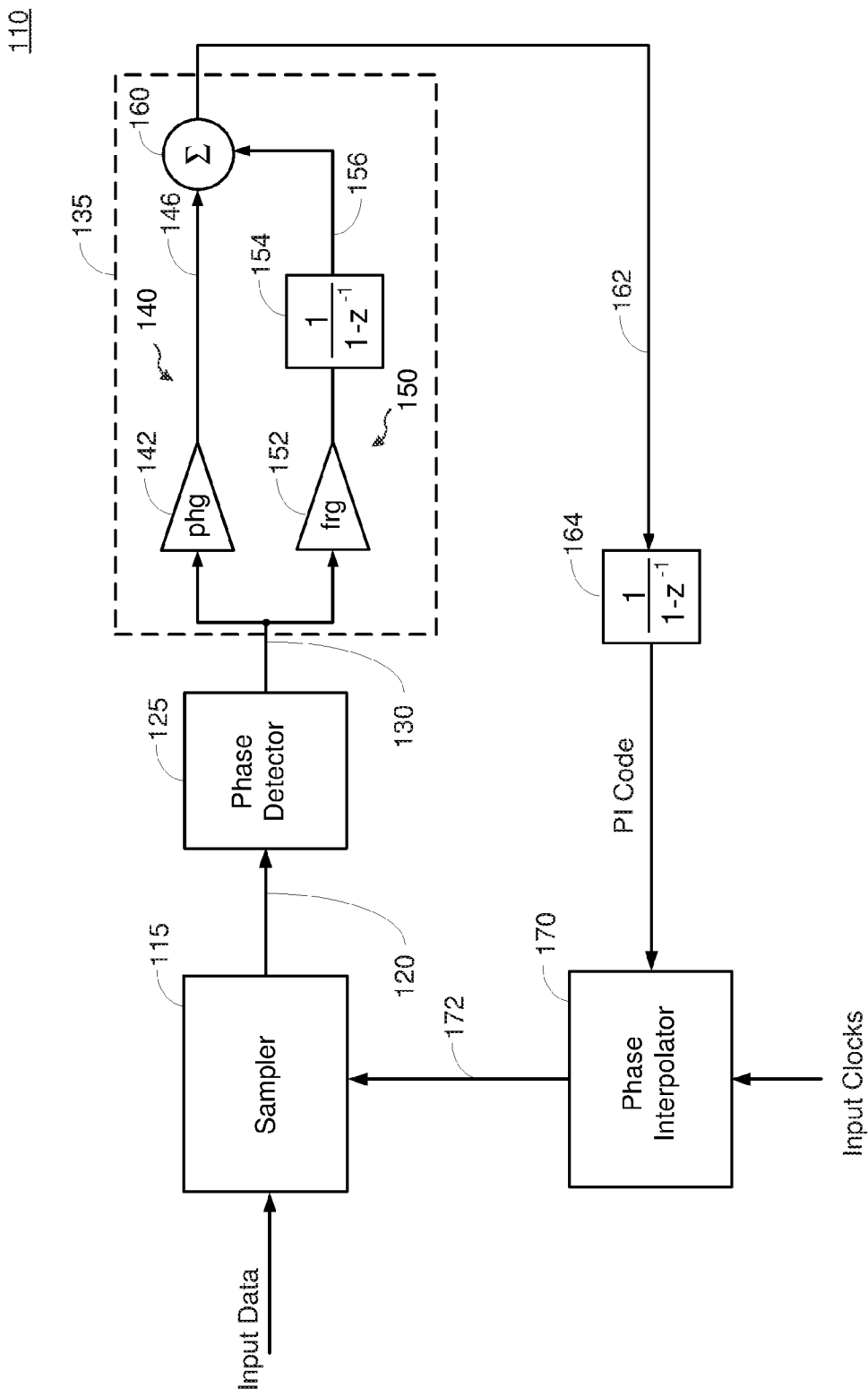
FIG. 1 shows an example of a clock data recovery (CDR) circuit according to certain aspects of the present disclosure.

FIG. 1 shows an example of a clock data recovery (CDR) circuit 110 according to certain aspects of the present disclosure. The CDR circuit 110 includes a sampler 115, a phase detector 125, a loop filter 135, an integrator 164, and a phase interpolator 170. The CDR circuit 110 may be used in a receiver to recover a clock signal from a data signal received by the receiver, and to sample the data signal using the recovered clock signal to recover data (e.g. data bits) from the data signal. The recovered data may be output to another component (not shown) in the receiver for further processing.

The sampler 115 receives the data signal at the receiver (e.g., from a high-speed serial data link or another type of data link). The data signal may undergo preprocessing (e.g., equalization, amplification, filtering, etc.) at the receiver before being input to the sampler 115. The sampler 115 also receives a set of clock signals 172 from the phase interpolator 170. The sampler 115 uses the set of clock signals 172 to sample the data signal to obtain data samples and phase samples, as discussed further below.

Figure 2A:
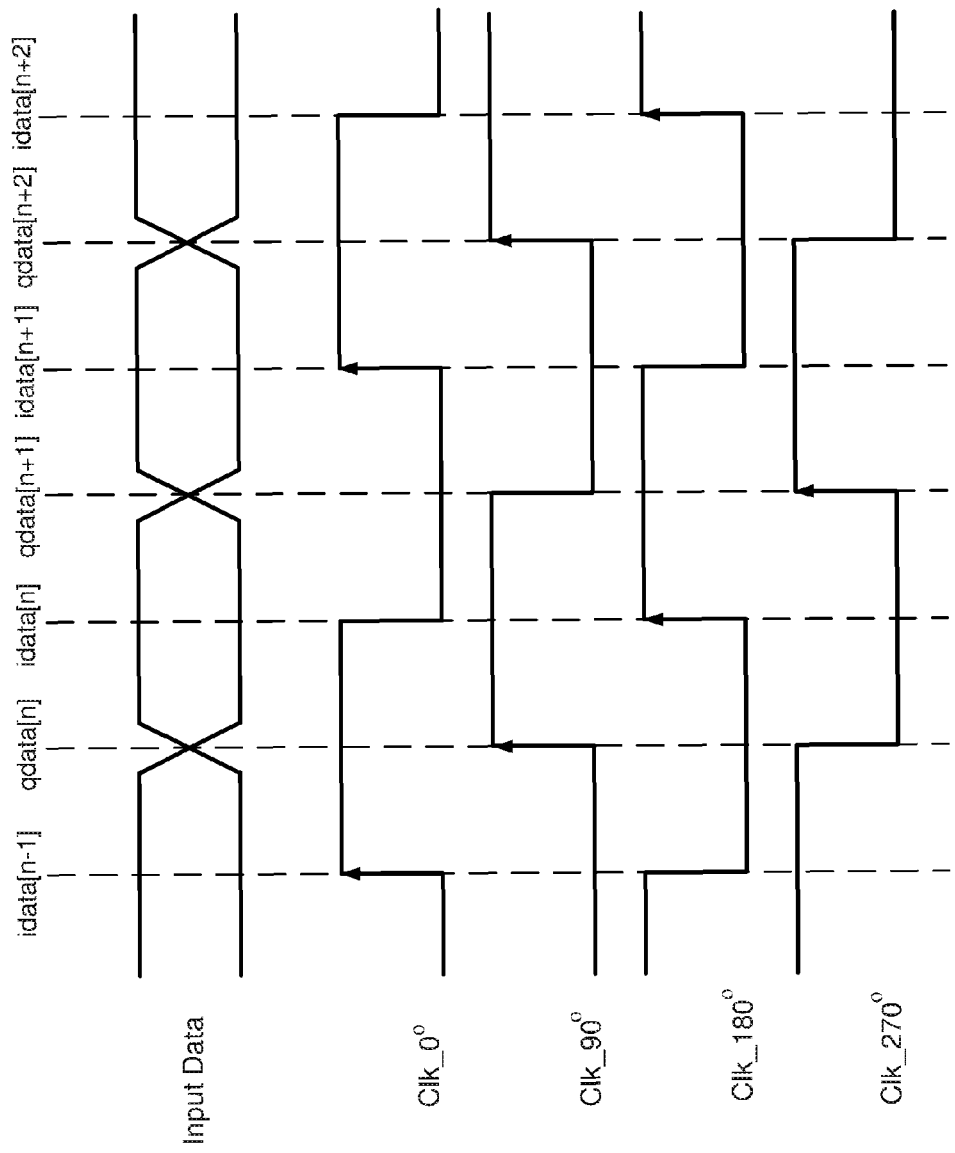
FIG. 2A is a timing diagram showing an example of a data signal and clock signals according to certain aspects of the present disclosure.

In certain aspects, the set of clock signals 172 includes multiple clock signals that are evenly spaced apart in phase. In this regard, FIG. 2A shows an example in which the set of clock signals 172 from the phase interpolator 170 includes four clock signals labeled "Clk_0°", "Clk_90°", "Clk_180°" and "Clk_270°". In this example, the four clock signals are spaced 90 degrees apart and each of the four clock signals has a clock period approximately equal to one data unit interval (UI). The sampler 115 samples the data signal on the rising edges of clock signals Clk_0° and Clk_180° to obtain data samples of the data signal (labeled "idata[ ]" in FIG. 2A). The data samples provide the data bits recovered from the data signal.

The sampler 115 also samples the data signal on the rising edges of clock signals "Clk_90°" and "Clk_270°" to obtain phase samples of the data signal (labeled "qdata[ ]" in FIG. 2A). The phase detector 125 uses the phase samples to detect phase errors between the data signal and the clock signals Clk_0°, Clk_90°, Clk_180° and Clk_270°, as discussed further below.

Figure 2B:
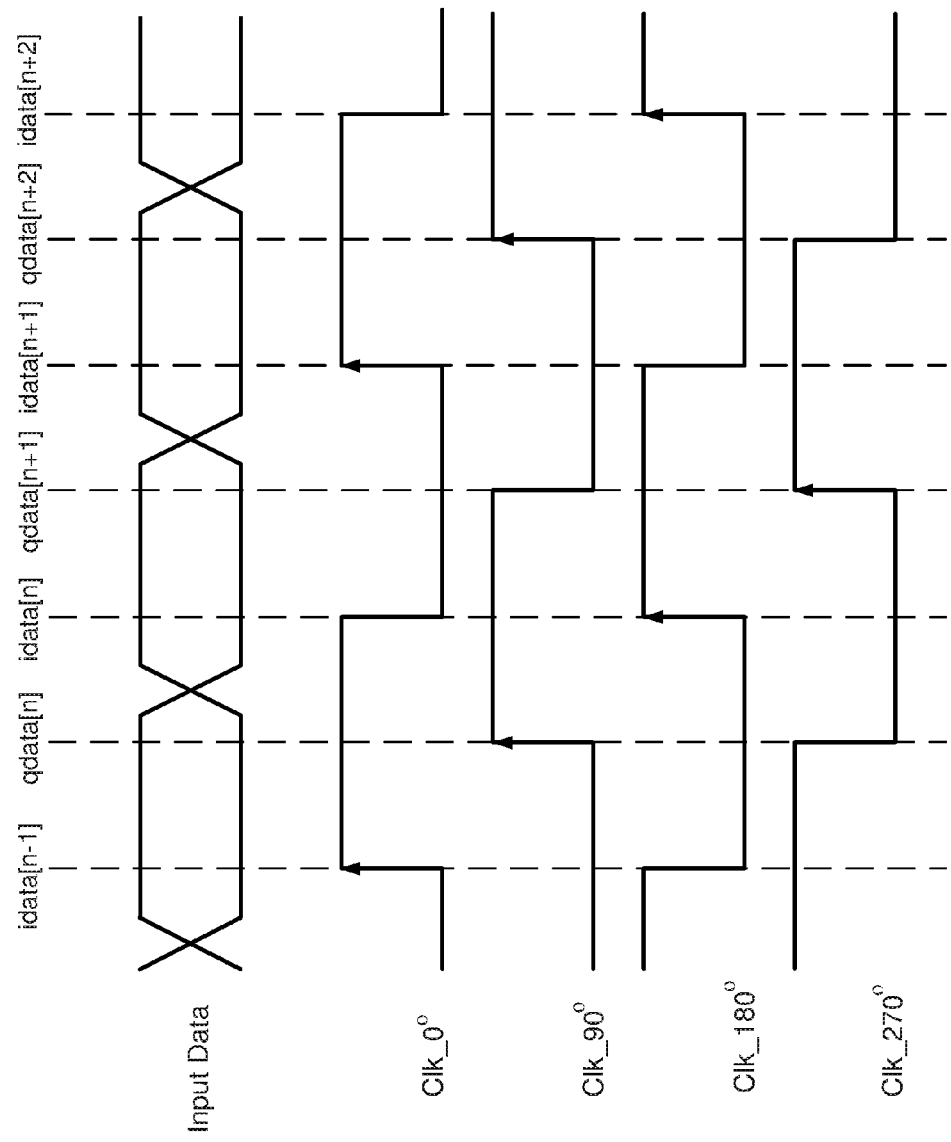
FIG. 2B is a timing diagram showing an example of the data signal and clock signals in which the clock signals are early according to certain aspects of the present disclosure.

FIG. 2A shows an ideal case in which the clock signals Clk_0°, Clk_90°, Clk_180° and Clk_270° are aligned with the data signal. In the ideal case, the rising edges of clock signals Clk_0° and Clk_180° are approximately centered with the data eyes of the data signal, and the rising edges of clock signals Clk_90° and Clk_270° are approximately centered with the transitions of the data signal. FIG. 2B shows an example in which the clock signals are early with respect to the data signal and FIG. 2C shows an example in which the clock signals are late with respect to the data signal, as discussed further below.

The sampler 115 outputs the data samples and the phase samples 120 to the phase detector 125. The phase detector 125 is configured to detect phase errors between the data signal and the clock signals using the data samples and the phase samples 120. In one example, the phase detector 125 determines a phase error based on the logic values of two adjacent data samples and the logic value of the phase sample between the two adjacent data samples. In this regard, the table in FIG. 3 illustrates logical functions of the phase detector 125 according to one example, in which the two adjacent data samples are labeled idata[n−1] and idata[n] and the phase sample is labeled qdata[n]. In this example, the phase detector 125 needs a data transition to determine a phase error. In other words, the logic values of data samples idata[n−1] and idata[n] need to be different for the phase detector 125 to determine the phase error. Also, in this example, the first data sample idata[n−1] is the data sample immediately preceding the phase sample qdata[n], and the second data sample idata[n] is the data sample immediately following the phase sample qdata[n].

If the logic value of the first data sample idata[n−1] is the same as the logic value of the phase sample qdata[n] and different from the logic value of the second data sample idata[n], then the phase detector 125 determines that the phases of the clock signals are early relative to the phases of the clock signals in the ideal case shown in FIG. 2A. An example of this is shown in FIG. 2B, in which the first data sample idata[n−1] and the phase sample qdata[n] correspond to the same value of the data signal, and the phase sample qdata[n] is taken before the data transition between the first and second data samples. In this case, the phase detector 125 may generate a phase error value of negative one indicating that the phases of the clock signals are early.

If the logic value of the second data sample idata[n] is the same as the logic value of the phase sample qdata[n] and different from the logic value of the first data sample idata[n−1], then the phase detector 125 determines that the phases of the clock signals are late relative to the phases of the clock signals in the ideal case shown in FIG. 2A. An example of this is shown in FIG. 2C, in which the second data sample idata[n] and the phase sample qdata[n] correspond to the same value of the data signal, and the phase sample qdata[n] is taken after the data transition between the first and second data samples. In this case, the phase detector 125 may generate a phase error value of positive one indicating that the phases of the clock signals are late.

If the logic values of the first and second data samples idata[n] and idata[n−1] are the same, then the phase detector 125 may generate a zero indicating a hold condition. In this case, the phase detector 125 does not have enough information to determine the phase error.

In certain aspects, the phase detector 125 outputs phase error values 130 at an update rate of one output phase error value for every N periods (cycles) of the data signal, where N is an integer. In one example, the phase detector 125 may generate N phase error values for each output phase error value 130, and generate the output phase error value 130 based on a majority vote of the N phase error values. An output phase error value may have a value of one indicating that the clock signals are late, a value of negative one indicating that the clock signals are early, or a value of zero indicating a hold condition.

The output phase error value 130 of the phase detector 125 is input to the loop filter 135. The loop filter 135 includes a proportional path 140 and an integration path 150, as shown in FIG. 1. The proportional path 140 includes a proportional gain device 142 with a proportional gain of phg. The integration path 150 includes an integration gain device 152 with an integration gain of frg, and an integrator 154. The integration path 150 provides frequency tracking for the CDR circuit 110. The proportional gain phg is greater than the integration gain frg to provide an adequate damping factor for loop stability.

The loop filter 135 also includes a summer 160 that combines the output signal 146 of the proportional path 140 and the output signal 156 of the integration path 150 to produce a combined signal 162. The integrator 164 integrates the combined signal 162 to produce a phase interpolator (PI) code, which is input to the phase interpolator 170.

The phase interpolator 170 adjusts the phases of the clock signals Clk_0°, Clk_90°, Clk_180° and Clk_270° based on the PI code. More particularly, the phase interpolator 170 shifts the phases of the clock signals Clk_0°, Clk_90°, Clk_180° and Clk_270° by the same amount based on the PI code. The phase interpolator 170 uses phase interpolation to generate the clock signals Clk_0°, Clk_90°, Clk_180° and Clk_270° from multiple input clock signals and to adjust the phases of the clock signals Clk_0°, Clk_90°, Clk_180° and Clk_270° based on the PI code.

In the example shown in FIG. 1, the CDR circuit 110 implements a second-order digital phase locked loop (PLL) with a loop gain given by:

$$K_{PD}\left(\frac{K_{PI}}{1-z^{-1}}\right)\left(phg + \frac{frg}{1-z^{-1}}\right)$$

where $K_{PD}$ is the gain of the phase detector 125 and $K_{PI}$ is the gain of the phase interpolator 170. The loop provides negative feedback that adjusts the phases of the clock signals Clk_0°, Clk_90°, Clk_180° and Clk_270° in a direction that decreases the phase error between the data signal and the clock signals Clk_0°, Clk_90°, Clk_180° and Clk_270°. The phase error corresponds to the deviation of the phases of the clock signals from the phases of the clock signals in the ideal case shown in FIG. 2A. For the case of clock signals Clk_0° and Clk_180° used to obtain the data samples, the phase error may correspond to deviation of the rising edges of clock signals Clk_0° and Clk_180° from the centers of the data eyes of the data signal. For the case of clock signals Clk_90° and Clk_270° used to obtain the phase samples, the phase error may correspond to deviation of the rising edges of clock signals Clk_90° and Clk_270° from the centers of the transitions of the data signal.

In the example discussed above, the phase detector 125 outputs a phase error value indicating the direction of the phase error (i.e., early or late). However, it is to be appreciated that the present disclosure is not limited to this example, and that the phase detector 125 may output a phase error value that also indicates the magnitude of the phase error.

Various standards for high-speed data signaling (e.g., USB3.1) require that the CDR circuit 110 meet a certain frequency tracking range. The tracking range may be defined as phase step size/phase update period. The phase update period may be given in unit intervals (UI), in which one UI corresponds to one period (cycle) of the data signal. For example, a phase update period of 4 UI indicates that the CDR circuit 110 updates phase every fourth period of the data signal.

The phase step size is also given in unit intervals (UI). For example, a phase step size of 2/64 UI corresponds to a phase step size of 2/64 of a period of the data signal.

For 5 Gbs operation, a phase update period of 4 UI and a phase step size of 2/64 UI results in a maximum tracking range of 2/64/4=7.8 Kppm. This is large enough to meet the USB3.1 specification.

If the frequency of the data signal is increased from 5 Gbs to 10 Gbs (i.e., the frequency of the data signal is doubled), then the CDR circuit 110 needs to operate at twice the frequency in order to keep the phase update period at 4 UI. In this case, the frequency at which the CDR circuit 110 needs to update the phase increases from 1.25 GHz (i.e., 5 GHz/4) to 2.5 GHz (i.e., 10 GHz/4). The increased frequency makes it harder for the CDR circuit 110 to meet timing requirement and increases power consumption.

One approach to address the above problem is to increase the phase update period. This slows down the phase update rate, making it easier for the CDR circuit 110 to meet timing. For example, the phase update period may be increased from 4 UI to 6 UI. However, a problem with this approach is that the tracking range is reduced. In this example, the tracking range is reduced to 2/64/6=5.2 Kppm, which does not meet the USB3.1 specification. The tracking range may be increased to meet the specification by increasing the phase step size. However, increasing the phase step size increases phase quantization error.

Figure 4:
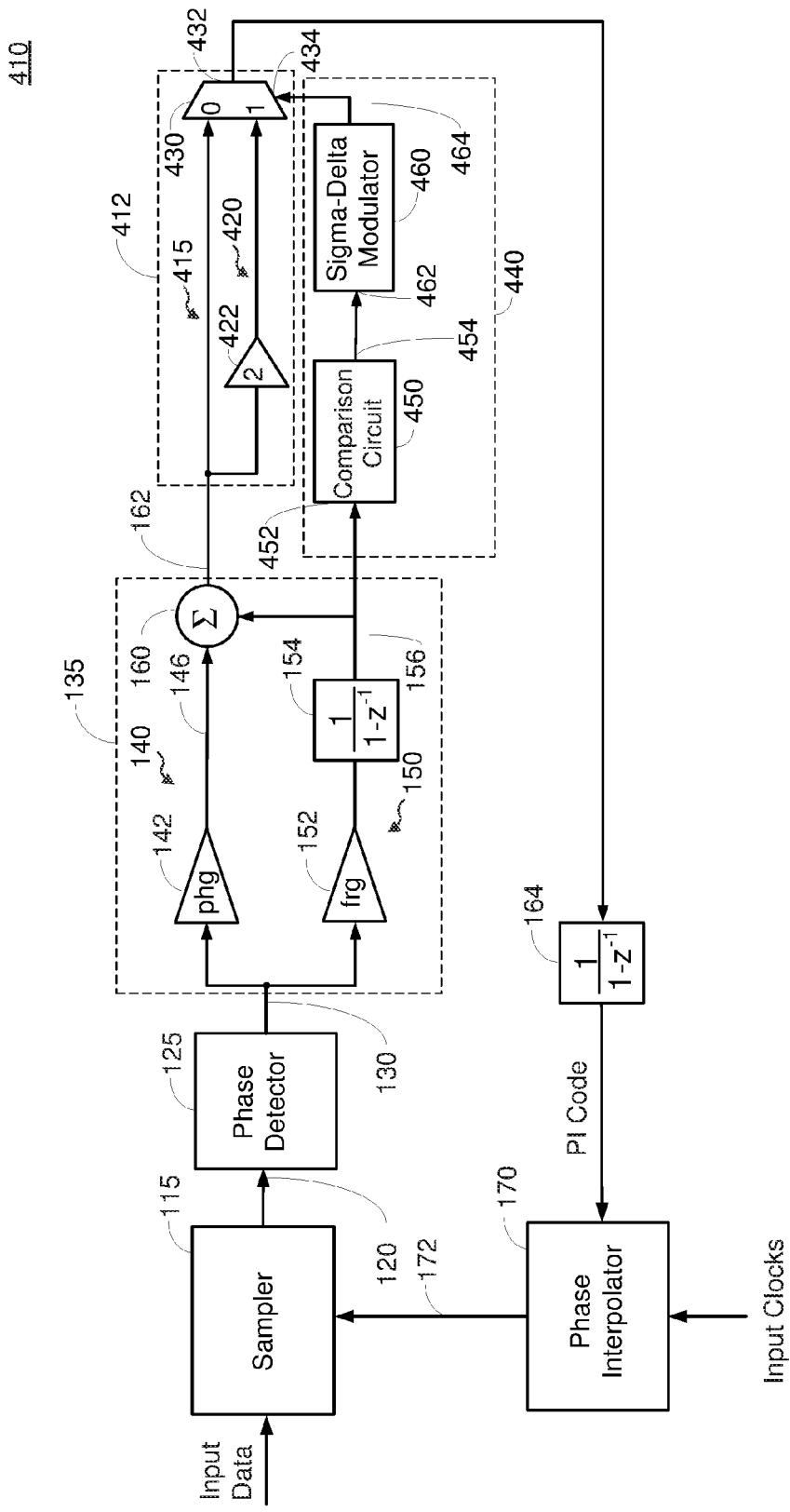
FIG. 4 shows an example of a phase step adjuster and a phase step controller according to certain aspects of the present disclosure.

FIG. 4 shows an example of a CDR circuit 410 according to certain aspects of the present disclosure. In the example in FIG. 4, the CDR circuit 410 includes the components of the CDR circuit 110 shown in FIG. 1. The components common to both CDR circuits 410 and 110 are shown in FIG. 4 with the same reference numbers as shown in FIG. 1. For brevity, the descriptions of the common components are not repeated here.

The CDR circuit 410 also includes a phase step adjuster 412, and a phase step controller 440. The phase step adjuster 412 is configured to adjust the phase step size of the CDR circuit 410 under the control of the phase step controller 440. In the example shown in FIG. 4, the phase step adjuster 412 is placed in the feedback loop of the CDR circuit 410 between the loop filter 135 and the integrator 164. The phase step controller 440 is configured to sense a frequency offset of the CDR circuit 410 from the output 156 of the integration path 150 of the loop filter 135, and to control the phase step adjuster 412 (and hence the phase step size of the CDR circuit 410) based on the sensed frequency offset, as discussed further below.

In the example in FIG. 4, the phase step adjuster 412 includes a first phase step path 415, a second phase step path 420, and a multiplexer 430. The multiplexer 430 has a first input (labeled "0") coupled to the first phase step path 415, a second input (labeled "1") coupled to the second phase step path 420, and an output 432 coupled to the integrator 164. The multiplexer 430 also has a select input 434 that receives a control signal from the phase step controller 440. The multiplexer 430 is configured to select one of the phase step paths 415 and 420 at a time based on the control signal from the phase step controller 440, and to couple the selected path to the output 432 of the multiplexer 430. In the example in FIG. 4, the multiplexer 430 selects the first phase step path 415 when the control signal is zero, and selects the second phase step path 420 when the control signal is one.

In the example in FIG. 4, the second phase step path 420 includes a phase step gain unit 422 with a gain of two. The gain of two doubles the phase step size of the CDR circuit 410 when the second phase step path 420 is selected compared to the phase step size of the CDR circuit 410 when the first phase step path 415 is selected. For example, if the CDR circuit 410 has a phase step size of 2/32 UI when the first phase step path 415 is selected, then the CDR circuit 410 has a phase step size of 2/16 UI when the second phase step path 420 is selected.

The phase step controller 440 includes a comparison circuit 450 and a sigma-delta modulator 460. The comparison circuit 450 has an input 452 coupled to the output 156 of the integration path 150 of the loop filter 135, and an output 454. Because the integration path 150 provides frequency tracking for the CDR circuit 410, the signal level at the output of the integration path 150 represents the frequency offset of the CDR circuit 410. The sigma-delta modulator 460 has an input 462 coupled to the output 454 of the comparison circuit 450 and an output 464 coupled to the select input 434 of the multiplexer 430. The sigma-delta modulator 460 performs sigma-delta modulation on the output signal 454 of the comparison circuit 450 to generate the control signal 464 (e.g., output bit stream) that is input to the select input 434 of the multiplexer 430, as discussed further below.

In operation, the comparison circuit 450 compares the frequency offset from the output 156 of the integration path 150 with a threshold. The comparison circuit 450 outputs a value of G to the sigma-delta modulator 460 if the frequency offset is above the threshold and outputs a value of 0 to the sigma-delta modulator 460 if the frequency offset is equal to or below the threshold, where G is a multi-bit value. As discussed above, the frequency offset may be given by the signal level at the output 156 of the integration path 150.

Thus, when the frequency offset is equal to or below the threshold, the comparison circuit 450 outputs a value of 0 to the sigma-delta modulator 460. In certain aspects, the sigma-delta modulator 460 outputs a bit steam of zeros, which is input to the select input 434 of the multiplexer 430. This causes the multiplexer 430 to select the first phase step path 415. Therefore, when the frequency offset is equal to or below the threshold, the phase step size of the CDR circuit 410 is the same as the CDR circuit 110 in FIG. 1. The value of the threshold may be set such that the phase step size provided by the first phase step path 415 provides a sufficient frequency tracking range for the CDR circuit 410 when the frequency offset of the CDR circuit 410 is equal to or below the threshold.

When the frequency offset is above the threshold, the comparison circuit 450 outputs a value of G to the sigma-delta modulator 460. In certain aspects, the sigma-delta modulator 460 performs sigma-delta modulation on the input value of G to convert the value of G into an output bit steam of ones and zeros, which is input to the select input 434 of the multiplexer 430. This causes the multiplexer 430 to dynamically switch between the first phase step path 415 and the second phase step path 420.

The density of ones in the output bit stream of the sigma-delta modulator 460 depends on the value of G, in which the density of ones is the proportion of ones in the output bit stream relative to the proportion of zeros in the output bit stream. The larger the value of G, the greater the density of ones in the output bit stream, and therefore, the greater the percentage of the time that the multiplexer 430 selects the second phase step path 420. The smaller the value of G, the lower the density of ones in the output bit stream, and therefore, the smaller the percentage of the time that the multiplexer 430 selects the second phase step path 420.

In certain aspects, the ones and zeros in the output bit stream are non-uniform. In other words, the ones and zeros are not uniformly distributed in the output bit stream. For example, if the output bit stream has equal numbers of ones and zeros, then the output bit stream does not include a one for every other bit or a zero for every other bit (i.e., two or more consecutive bits may be all ones or all zeros).

The time-average phase step size of the CDR circuit 410 during dynamic switching depends on the percentage of the time that the multiplexer 430 selects the second phase step path 420, which, in turn, depends on the density of ones in the output bit stream of the sigma-delta modulator 460. The higher the density of ones in the output bit stream, the greater the percentage of the time that the multiplexer 430 selects the second phase step path 420, and therefore, the larger the time-average phase step size of the CDR circuit 410. Because the density of ones in the output bit stream depends on the value of G output by the comparison circuit 450, the time-average phase step size of the CDR circuit 410 also depends on the value of G. The larger the value of G, the larger the time-average phase step size of the CDR circuit 410. Thus, the value of G may be used to control the time-average phase step size of the CDR circuit 410 during dynamic switching.

The time-average phase step size is between the phase step size provided by the first phase step path 415 and the phase step size provided by the second phase step path 420. Therefore, for the example shown in FIG. 4 in which the second phase step path 420 has a phase step gain of two, the time-average phase step size is M times the phase step size provided by the first phase step path 415, where M is a number between one and two. As the value of G is increased, the time-average phase step size of the CDR circuit 410 approaches two times the phase step size provided by the first phase step path 415 since the second phase step path 420 is selected more often.

The time-average phase step size of the CDR circuit 410 discussed above may be the time-average of the phase step size of the CDR circuit 410 over a period of time equal to one phase error update period or multiple phase error update periods. In this example, one phase error update period is the period of time between updates of the output phase error values output by the phase detector 125.

Thus, when the frequency offset exceeds the threshold, the sigma-delta modulator 460 dynamically switches the phase step adjuster 412 between the first phase step path 415 and the second phase step path 420. In other words, the sigma-delta modulator 460 dynamically switches the phase step adjuster 412 between a first phase step size and a second phase step size, in which the first phase step size is the phase step size provided by the first phase step path 415 and the second phase step size is the phase step size provided by the second phase step path 420. In the example shown in FIG. 4, the second phase step size is twice the first phase step size. The switching generates a time-average phase step size that is between the first phase step size and the second phase step size, in which the time-average phase step size depends on the value of G output by the comparison circuit 450.

The time-average phase step size is larger than the first phase step size (assuming the second phase step path 420 is selected at least some of the time), and therefore increases the frequency tracking range of the CDR circuit 410. The larger the time-average phase step size, the larger the increase in the frequency tracking range. Thus, when the frequency offset of the CDR circuit 410 exceeds the threshold, the phase step adjuster 412 and phase step controller 440 increase the frequency tracking range of the CDR circuit 410.

The increase in the frequency tracking range of the CDR circuit 410 when the frequency offset exceeds the threshold depends on the time-average phase step size, which, in turn, depends on the value of G. In this regard, the value of G may be set such that the increased frequency tracking range of CDR circuit 410 meets (satisfies) a frequency tracking range specified by a standard (e.g., USB3.1 specification). For example, if a phase step size that is 1.5 times the first phase step size achieves a frequency tracking range specified by the standard, then the value of G may be set to a value that results in a time-average phase step size of approximately 1.5 times the first phase step size.

In certain aspects, the sigma-delta modulator 460 pushes (shapes) quantization noise to frequencies that are higher than the bandwidth of the CDR loop. As a result, the quantization noise pushed out to the higher frequencies is filtered out by the CDR loop, thereby reducing quantization noise. Thus, the sigma-delta modulator 460 allows the phase step size to be increased for increased tracking range when the frequency offset exceeds the threshold while reducing the quantization noise.

Although embodiments of the present disclosure are discussed above using the example of a phase step gain of two for the second phase step path 420, it is to be understood that embodiments of the present disclosure are not limited to this example. Accordingly, it is to be understood that the phase step gain unit 422 in the second phase step path 420 may have a phase step gain other than two (e.g., a phase step gain of four).

Although sigma-delta modulation is used to convert the output signal 454 of the comparison circuit 450 into the control signal 464 for the multiplexer 430 in the above examples, it is to be appreciated that the present disclosure is not limited to sigma-delta modulation. Accordingly, it is to be understood that the phase step controller 440 may include another type of modulator to convert the output signal 454 of the comparison circuit 450 into the control signal 464 for the multiplexer 430. This modulator may employ a modulation scheme that pushes quantization noise to frequencies that are higher than the bandwidth of the CDR loop to reduce quantization noise.

Figure 5:
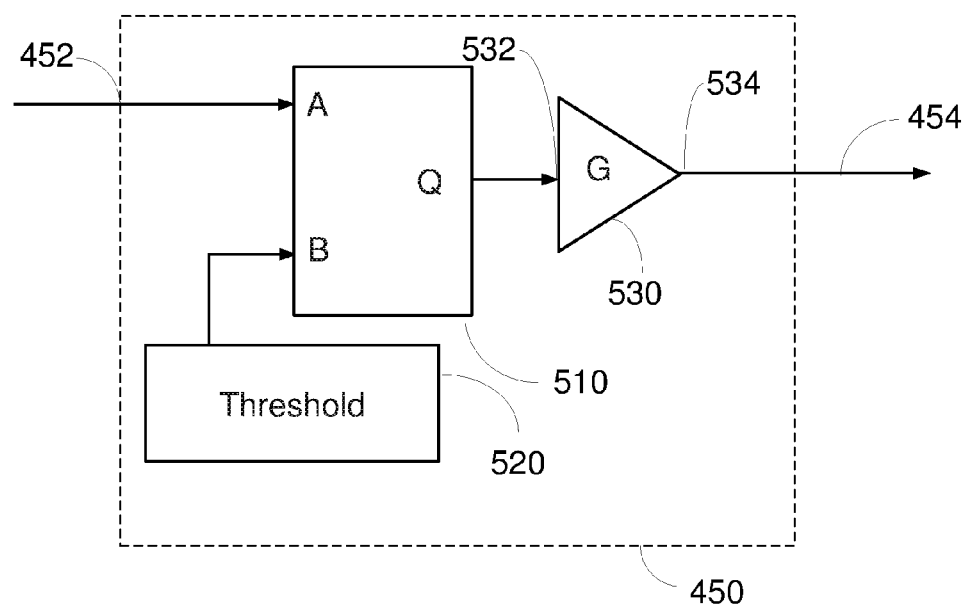
FIG. 5 shows an example of a comparison circuit according to certain aspects of the present disclosure.

FIG. 5 shows an exemplary implementation of the comparison circuit 450 according to certain aspects of the present disclosure. In this example, the comparison circuit 450 includes a comparator 510 and a gain unit 530. The comparator 510 has a first input (labeled "A") that receives the frequency offset from the integration path 150 of the loop filter 135 (not shown in FIG. 5), a second input (labeled "B") that receives the threshold, and an output (labeled "Q"). The threshold may be a multi-bit value stored in a register 520 coupled to the second input of the comparator 510. The gain unit 530 has an input 532 coupled to the output of the comparator 510, and an output 534 coupled to the output 454 of the comparison circuit 450. The gain unit 530 is configured to apply a gain of G to the output of the comparator 510.

In operation, the comparator 510 is configured to compare the frequency offset at the first input of the comparator with the threshold at the second input of the comparator. If the frequency offset is equal to or less than the threshold, then the comparator 510 outputs zero to the gain unit 530 (i.e., Q=0). In this case, the gain unit 530 outputs a value of 0 to the output 454 of the comparison circuit 450 and the multiplexer 430 selects the first path 415. If the frequency offset is above the threshold, then the comparator 510 outputs a positive one to the gain unit 530 (i.e., Q=1). In this case, the gain unit 530 outputs a value of G to the output 454 of the comparison circuit 450. The value G is converted to a sequence of zeros and ones by the sigma-delta modulator 460. The multiplexer 430 is dynamically controlled by the sequence at the output 464 of the sigma-delta modulator 460.

Figure 6:
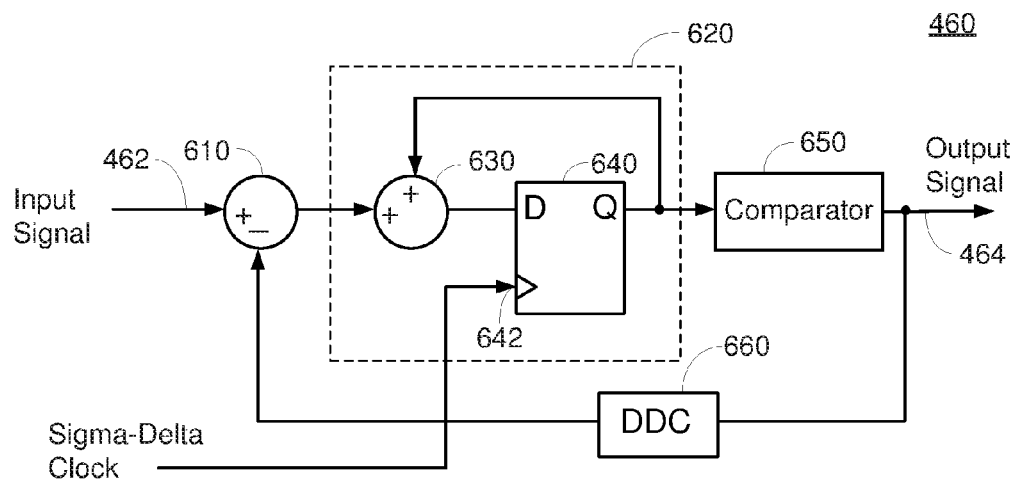
FIG. 6 shows an example of a sigma-delta modulator according to certain aspects of the present disclosure.

FIG. 6 shows an exemplary implementation of the sigma-delta modulator 460 according to certain aspects of the present disclosure. In this example, the sigma-delta modulator 460 includes a subtractor 610, an integrator 620, a comparator 650, and a digital-to-digital converter (DDC) 660.

In operation, the DDC 660 receives the output signal 464 (e.g., output bit stream) of the sigma-delta modulator 460, and performs digital-to-digital conversion on the output signal 464 to convert values (e.g., bit values) of the output signal 464 into respective feedback values that are fed back to the subtractor 610. Each feedback value may have one of two values depending on the respective value of the output signal (e.g., one or zero). Each feedback value may be a single-bit or a multi-bit value. The subtractor 610 subtracts each feedback value from the input signal 452 of the sigma-delta modulator 460 to obtain a difference value.

The integrator 620 integrates difference values from the subtractor 610, and outputs the resulting integration values to the comparator 650. In the example in FIG. 6, the integrator 620 includes a summer 630 and a flip-flop 640. The flip-flop 640 has a data input (labeled "D"), an output (labeled "Q"), and a clock input 642 coupled to a sigma-delta clock signal. The flip-flop 640 is configured to latch the value at the data input of the flip-flop 640 on each rising edge of the sigma-delta clock signal, and to output the latched value at the output of the flip-flop 640. The summer 630 is configured to sum the output of the flip-flop 640 with the output of the subtractor 610, and to output the resulting sum to the data input of the flip-flop 640. This configuration causes the summer 630 and the flip-flop 640 to accumulate the difference values from the subtractor 610 at the frequency of the sigma-delta clock signal. As a result, the integrator 620 updates the integration value to the comparator 650 at a rate of one integration value per period (cycle) of the sigma-delta clock signal.

The comparator 650 compares each integration value from the integrator 620 with a sigma-delta threshold (not to be confused with the threshold of the comparison circuit 450). If the integration value is below the sigma-delta threshold, then the comparator 650 outputs a zero to the output 464 of the sigma-delta modulator 460. If the integration value is equal to or above the sigma-delta threshold, then the comparator 650 outputs a one to the output 464 of the sigma-delta modulator 460. The sigma-delta threshold may be a single-bit value or a multi-bit value. Since the integration value from the integrator 620 is updated at a rate of one integration value per period (cycle) of the sigma-delta clock signal, the output of the comparator 650 (and hence the output of the sigma-delta modulator 460) is updated at a rate of one output value per period (cycle) of the sigma-delta clock signal.

As discussed above, the density of ones in the output bit stream of the sigma-delta modulator 460 during dynamic switching of the phase step adjuster 412 depends on the value of G output by the comparison circuit 450. In the example shown in FIG. 6, the density of ones in the output bit stream of the sigma-delta modulator 460 during dynamic switching of the phase step adjuster 412 also depends on the sigma-delta threshold used by the comparator 650. More particularly, the density of ones in the output bit stream depends on the ratio of the value of G over the value of the sigma-delta threshold. The larger the ratio, the greater the density of ones in the output bit stream, and, the lower the ratio, the smaller the density of ones in the output bit stream. Thus, in this example, the time-average phase step size of the CDR circuit 410 during dynamic switching of the phase step adjuster 412 may be set to a desired value by setting the ratio of the value of G over the value of the sigma-delta threshold accordingly.

FIG. 6 shows an example in which the sigma-delta modulator 460 is implemented with a single-order sigma-delta modulator. However, it is to be understood that the sigma-delta modulator 460 is not limited to this example, and may be implemented with a higher-order sigma-delta modulator that includes two or more integrators.

Figure 7:
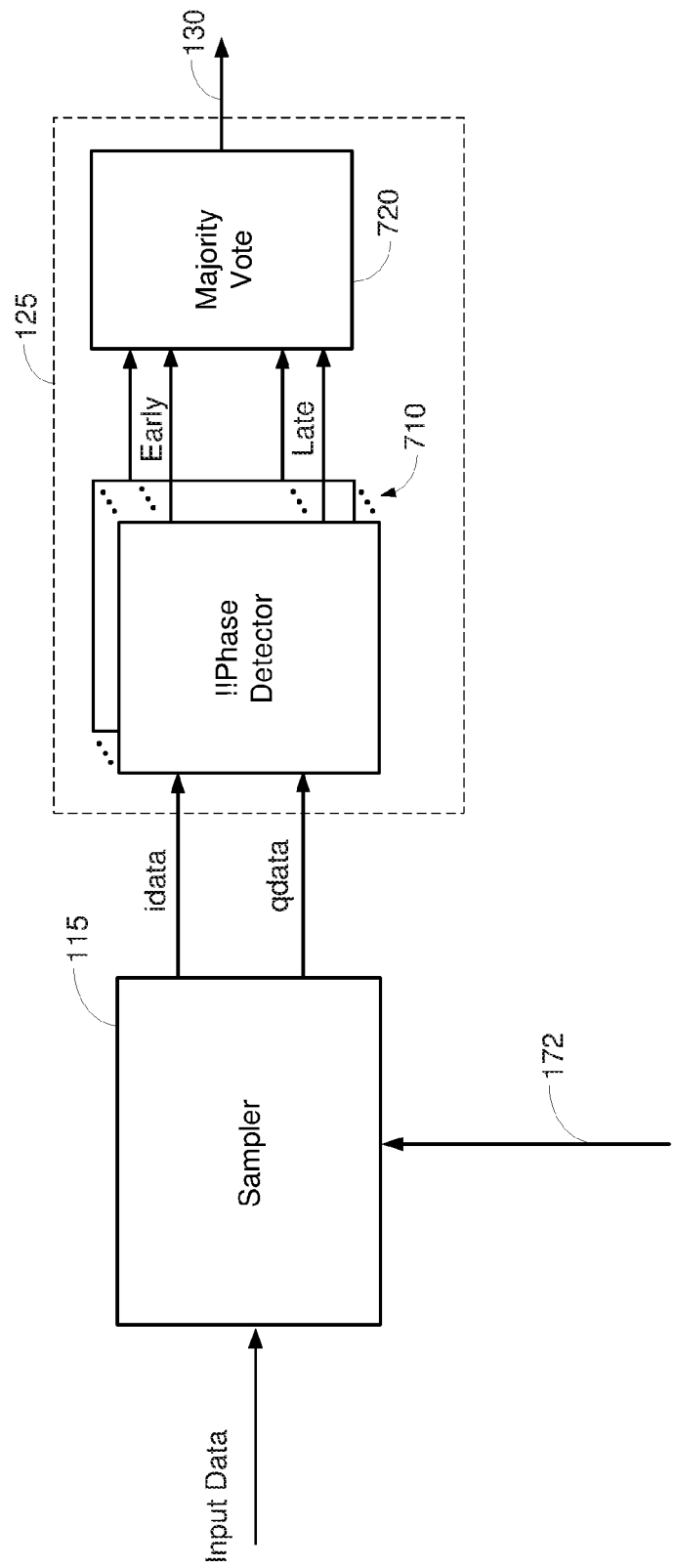
FIG. 7 shows an example of a phase detector according to certain aspects of the present disclosure.

FIG. 7 shows an exemplary implementation of the phase detector 125 according to certain aspects of the present disclosure. In this example, the phase detector 125 includes a bank of phase detectors 710, and a majority vote circuit 720. Each of the phase detectors 710 may be a bang-bang phase detector (labeled "!!Phase Detector" in FIG. 7) or another type of phase detector.

In operation, the phase detectors 710 receive data samples and phase samples from the sampler 115, and output multiple phase error values to the majority vote circuit 720. For example, for each update period of the output phase error value 130, the phase detectors 710 may generate N phase error values in parallel, and output the N phase error values to the majority vote circuit 720. The majority vote circuit 720 may then perform majority voting on the N phase error values to generate the output phase error value 130. In this example, the N phase error values may be based on N consecutive phase samples, in which each of the phase detectors 710 generates a respective one of the N phase errors using a respective one of the N consecutive phase samples. Each of the phase detectors 710 may generate the respective phase error value using the respective phase sample, the data sample immediately preceding the respective phase sample, and the data sample immediately following the respective phase sample (e.g., according to the Table shown in FIG. 3).

Figure 8:
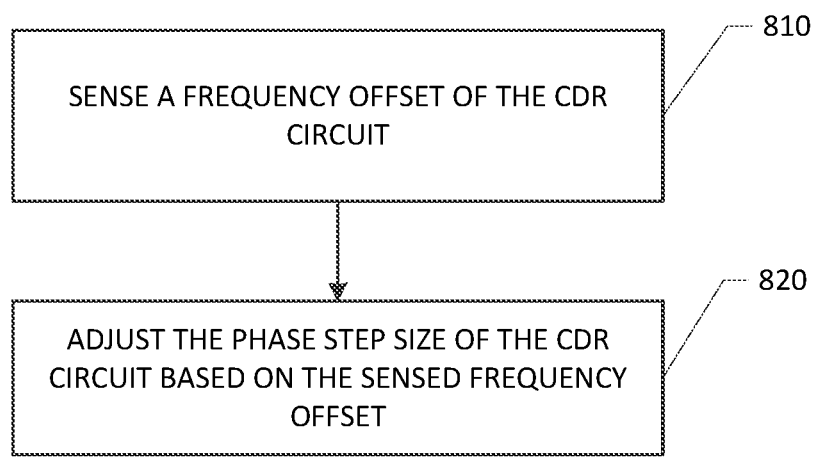
FIG. 8 is a flowchart showing a method for adjusting a phase step size of a clock data recovery (CDR) circuit according to certain aspects of the present disclosure.

FIG. 8 is a flowchart illustrating a method 800 for adjusting a phase step size of a clock data recovery (CDR) circuit according to certain aspects of the present disclosure. The method 800 may be performed by the phase step adjuster 412 and the phase step controller 440.

At step 810, a frequency offset of the CDR circuit is sensed. For example, sensing the frequency offset may include sensing a signal level on an integration path (e.g., integration path 150) of a loop filter (e.g., loop filter 135) of the CDR circuit.

At step 820, the phase step size of the CDR circuit is adjusted based on the sensed frequency offset. For example, adjusting the phase step size may include switching the CDR circuit between a first phase step size and a second phase step size based on the sensed frequency offset using a modulator (e.g., sigma-delta modulator 460).

In certain aspects, adjusting the phase step size at step 820 may include comparing the sensed frequency offset with a threshold, generating an input signal (e.g., signal 454) based on the comparison, modulating the input signal with the modulator to generate a control signal (e.g., signal 464), and switching the CDR circuit between the first phase step size and the second phase step size based on the control signal. For example, the input signal may have a first input value (e.g., G) if the sensed frequency offset is greater than the threshold, and a second input value (e.g., 0) if the sensed frequency offset is less than the threshold. The modulation may include sigma-delta modulation or another type of modulation.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two components. The term "circuit" is used broadly, and intended to cover hardware implementations of electrical devices and conductors that, when connected and configured, enable the performance of the functions described in the present disclosure. The term "circuit" is also intended to cover software implementations, in which a processor performs the functions described herein by executing software comprising code for performing the functions. The software may be stored on a computer-readable storage medium, such as a RAM, a ROM, an EEPROM, an optical disk, and/or a magnetic disk.

It is to be understood that present disclosure is not limited to the specific order or hierarchy of steps in the methods disclosed herein. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A method for adjusting a phase step size of a clock data recovery (CDR) circuit, wherein the CDR circuit recovers a clock signal from a data signal received by a receiver and samples the data signal using the recovered clock signal to recover data from the data signal, wherein the CDR circuit includes a loop filter, and wherein the loop filter includes an integration path that integrates phase error values of the CDR circuit, a proportional path that applies a proportional gain to the phase error values of the CDR circuit, and a summer that combines an output of the integration path and an output of the proportional path, the method comprising:

sensing a signal level on the integration path; and adjusting the phase step size of the CDR circuit based on the sensed signal level.

2. The method of claim 1, wherein adjusting the phase step size of the CDR circuit comprises:

switching the CDR circuit between a first phase step size and a second phase step size based on the sensed signal level using a modulator.

3. The method of claim 2, wherein the modulator comprises a sigma-delta modulator.

4. A method for adjusting a phase step size of a clock data recovery (CDR) circuit, wherein the CDR circuit recovers a clock signal from a data signal received by a receiver and samples the data signal using the recovered clock signal to recover data from the data signal, the method comprising:

sensing a frequency offset of the CDR circuit;

comparing the sensed frequency offset with a threshold;

generating an input signal based on the comparison;

modulating the input signal with the modulator to generate a control signal; and adjusting the phase step size of the CDR circuit by switching the CDR circuit between a first phase step size and a second phase step size based on the control signal.

5. The method of claim 4, wherein the input signal has a first input value if the sensed frequency offset is greater than the threshold, and a second input value if the sensed frequency offset is less than the threshold.

6. The method of claim 5, wherein the modulator comprises a sigma-delta modulator.

7. The method of claim 4, wherein switching the CDR circuit between the first phase step size and the second phase step size comprises:

switching the CDR circuit between a first phase step path and a second phase step path, the first phase step path providing the first phase step size and the second phase step path providing the second phase step size.

8. The method of claim 4, wherein sensing the frequency offset of the CDR circuit comprises:

sensing a signal level on an integration path of the CDR circuit.

9. The method of claim 8, wherein comparing the sensed frequency offset with the threshold comprises:

comparing the sensed signal level with the threshold.

10. The method of claim 9, wherein the modulator comprises a sigma-delta modulator.

11. The method of claim 9, wherein the input signal has a first input value if the sensed signal level is greater than the threshold, and a second input value if the sensed signal level is less than the threshold.

12. The method of claim 11, wherein the modulator comprises a sigma-delta modulator.

13. An apparatus, comprising:

a phase step adjuster configured to adjust a phase step size of a clock data recovery (CDR) circuit, wherein the CDR circuit recovers a clock signal from a data signal received by a receiver and samples the data signal using the recovered clock signal to recover data from the data signal, wherein the CDR circuit includes a loop filter, and wherein the loop filter includes an integration path that integrates phase error values of the CDR circuit, a proportional path that applies a proportional gain to the phase error values of the CDR circuit, and a summer that combines an output of the integration path and an output of the proportional path; and a phase step controller configured to sense a signal level on the integration path, and to control the phase step adjuster to adjust the phase step size of the CDR circuit based on the sensed signal level.

14. The apparatus of claim 13, wherein the phase step adjuster is configured to adjust the phase step size of the CDR circuit by switching the CDR circuit between a first phase step size and a second phase step size based on the sensed signal level.

15. An apparatus comprising:
a phase step adjuster configured to adjust a phase step size of a clock data recovery (CDR) circuit, wherein the CDR circuit recovers a clock signal from a data signal received by a receiver and samples the data signal using the recovered clock signal to recover data from the data signal;
a comparison circuit configured to sense a frequency offset of the CDR circuit, to compare the sensed frequency offset with a threshold, and to generate an input signal based on the comparison; and
a modulator configured to modulate the input signal to generate a control signal, wherein the phase step adjuster adjusts the phase step size of the CDR circuit based on the control signal.

16. The apparatus of claim 15, wherein the modulator comprises a sigma-delta modulator.

17. The apparatus of claim 15, wherein the phase step adjuster adjusts the phase step size of the CDR circuit by switching the CDR circuit between a first phase step size and a second phase step size.

18. The apparatus of claim 15, wherein the phase step adjuster comprises:
a first phase step path providing a first phase step size;
a second phase step path providing a second phase step size; and
a multiplexer configured to select between the first phase step path and the second phase step path based on the control signal.

19. The apparatus of claim 18, wherein the phase step adjuster is coupled between a loop filter and an integrator of the CDR circuit.

20. The apparatus of claim 15, wherein the input signal has a first input value if the sensed frequency offset is greater than the threshold, and a second input value if the sensed frequency offset is less than the threshold.

21. The apparatus of claim 15, wherein the sensed frequency offset of the CDR circuit comprises a sensed signal level on an integration path of the CDR circuit.

22. The apparatus of claim 21, wherein the modulator comprises a sigma-delta modulator.

* * * * *